(12) United States Patent
Harada et al.

(10) Patent No.: US 11,101,072 B2
(45) Date of Patent: Aug. 24, 2021

(54) CAPACITOR WITH LIMITED SUBSTRATE CAPACITANCE

(71) Applicant: Murata Manufacturing Co., Ltd., Nagaokakyo (JP)

(72) Inventors: Masatomi Harada, Nagaokakyo (JP); Junko Izumitani, Nagaokakyo (JP); Takeshi Kagawa, Nagaokakyo (JP); Nobuhiro Ishida, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 16/221,789

(22) Filed: Dec. 17, 2018

(65) Prior Publication Data

US 2019/0122820 A1 Apr. 25, 2019

Related U.S. Application Data

(63) Continuation of application No. PCT/JP2017/021240, filed on Jun. 8, 2017.

(30) Foreign Application Priority Data

Jun. 28, 2016 (JP) .............................. JP2016-128047

(51) Int. Cl.
*H01G 4/33* (2006.01)
*H01G 4/228* (2006.01)
(Continued)

(52) U.S. Cl.
CPC ............. *H01G 4/018* (2013.01); *H01G 4/008* (2013.01); *H01G 4/12* (2013.01); *H01G 4/228* (2013.01);
(Continued)

(58) Field of Classification Search
CPC ............ H01G 4/33; H01G 4/005; H01G 4/06; H01G 4/012; H01G 4/228; H01L 27/016
See application file for complete search history.

(56) References Cited

U.S. PATENT DOCUMENTS 4,423,087 A 12/1983 Howard et al.
7,567,424 B2 7/2009 Yoshizawa
(Continued)

FOREIGN PATENT DOCUMENTS

JP S58115843 A 7/1983
JP H08241830 A 9/1996
(Continued)

OTHER PUBLICATIONS

International Search Report issued in PCT/JP2017/021240, dated Aug. 22, 2017.
(Continued)

*Primary Examiner* — David M Sinclair
(74) *Attorney, Agent, or Firm* — Arent Fox LLP

(57) ABSTRACT

A capacitor that prevents generation of a substrate capacitance composed of an upper electrode, a substrate, and a lower electrode. Specifically, the capacitor includes a substrate; a lower electrode disposed on the substrate; a dielectric film disposed on the lower electrode; an upper electrode disposed on a part of the dielectric film; and a first terminal electrode that is connected to the upper electrode. Moreover, the upper electrode and the first terminal electrode are formed in a region for forming the lower electrode in a plan view of the capacitor viewed from the first terminal electrode side.

14 Claims, 6 Drawing Sheets

(51) Int. Cl.
*H01G 4/018* (2006.01)
*H01L 27/04* (2006.01)
*H01G 4/12* (2006.01)
*H01L 21/822* (2006.01)
*H01G 4/008* (2006.01)
*H01L 27/01* (2006.01)

(52) U.S. Cl.
CPC ............. *H01G 4/33* (2013.01); *H01L 21/822* (2013.01); *H01L 27/016* (2013.01); *H01L 27/04* (2013.01)

(56) References Cited

U.S. PATENT DOCUMENTS

| | | | |
|---|---|---|---|
| 7,793,396 | B2 | 9/2010 | Shioga et al. |
| 7,940,516 | B2 | 5/2011 | Shioga et al. |
| 8,004,064 | B2 | 8/2011 | Shoji |
| 8,487,718 | B2 | 7/2013 | Kurioka |
| 8,907,449 | B2 | 12/2014 | Takahashi et al. |
| 2001/0001488 | A1* | 5/2001 | Eastep ............. H01L 29/40114 257/295 |
| 2003/0219956 | A1* | 11/2003 | Mori ............. H05K 1/185 438/393 |
| 2004/0178436 | A1* | 9/2004 | Baniecki ............. H01L 27/0805 257/310 |
| 2006/0046377 | A1* | 3/2006 | Koiwa ............. H01L 23/5223 438/238 |
| 2007/0097596 | A1* | 5/2007 | Kuwajima ............. H01G 4/01 361/311 |
| 2008/0068780 | A1 | 3/2008 | Shioga et al. |
| 2008/0237794 | A1* | 10/2008 | Shoji ............. H01G 4/012 257/532 |
| 2008/0239626 | A1 | 10/2008 | Yoshizawa |
| 2009/0121316 | A1* | 5/2009 | Zelner ............. H01L 21/02112 257/532 |
| 2009/0244808 | A1* | 10/2009 | Ohtsuka ............. H01G 4/06 361/311 |
| 2010/0044831 | A1* | 2/2010 | Guegan ............. H01L 28/60 257/532 |
| 2010/0178878 | A1 | 7/2010 | Kurioka |
| 2010/0321911 | A1 | 12/2010 | Shioga et al. |
| 2011/0193194 | A1 | 8/2011 | Takahashi et al. |
| 2014/0092524 | A1* | 4/2014 | Kim ............. H01G 4/01 361/305 |
| 2015/0279924 | A1 | 10/2015 | Matsushita |
| 2016/0163463 | A1* | 6/2016 | Namikawa ............. H01G 4/30 361/301.3 |
| 2017/0309404 | A1* | 10/2017 | Watanabe ............. H01G 4/33 |

FOREIGN PATENT DOCUMENTS

| | | | |
|---|---|---|---|
| JP | 2002280261 | A | 9/2002 |
| JP | 2003224033 | A | 8/2003 |
| JP | 2004071589 | A * | 3/2004 |
| JP | 2004172154 | A | 6/2004 |
| JP | 2007299939 | A | 11/2007 |
| JP | 2008078299 | A | 4/2008 |
| JP | 2008243971 | A | 10/2008 |
| JP | 2008251972 | A | 10/2008 |
| JP | 2009295925 | A * | 12/2009 |
| JP | 2010021234 | A * | 1/2010 |
| JP | 2010045297 | A * | 2/2010 |
| JP | 2010109014 | A | 5/2010 |
| JP | 2012015326 | A * | 1/2012 |
| JP | 2015192037 | A | 11/2015 |
| WO | 2008149622 | A1 | 12/2008 |

OTHER PUBLICATIONS

Written Opinion of the International Searching Authority issued in PCT/JP2017/021240, dated Aug. 22, 2017.

* cited by examiner

CAPACITOR WITH LIMITED SUBSTRATE CAPACITANCE

CROSS REFERENCE TO RELATED APPLICATIONS

The present application is a continuation of PCT/JP2017/021240 filed Jun. 8, 2017, which claims priority to Japanese Patent Application No. 2016-128047, filed Jun. 28, 2016, the entire contents of each of which are incorporated herein by reference.

TECHNICAL FIELD

The present disclosure relates to a capacitor.

BACKGROUND

Metal-insulator-metal (MIM) capacitors are well known as a representative capacitor element applied to a semiconductor integrated circuit. The MIM capacitor is a capacitor having a parallel plate type structure in which an insulator is sandwiched between a lower electrode and an upper electrode.

For example, Patent Document 1 (identified below) discloses a technique for providing a thin film MIM capacitor that prevents degradation of insulation characteristics and leakage current characteristics. The thin film MIM capacitor described in Patent Document 1 includes a substrate, a lower electrode made of a noble metal and formed on the substrate, a dielectric layer thin film formed on the lower electrode, and an upper electrode made of a noble metal and formed on the dielectric layer thin film.

Patent Document 1: Japanese Patent Application Laid-Open No. 2010-109014.

The capacitor of Patent Document 1 includes a terminal electrode for electrically connecting upper and lower electrodes to an external portion. However, when the terminal electrode that is connected to the upper electrode extends beyond the region for forming the lower electrode, the terminal electrode connected to the upper electrode approaches the lower electrode, whereby the electrodes are capacitively coupled across the substrate. This results in generation of a stray capacitance composed of the upper electrode, the substrate, and the lower electrode, which is connected in parallel with a true capacitance composed of the upper electrode, the dielectric film, and the lower electrode. The stray capacitance composed of the upper electrode, the substrate, and the lower electrode can be considered as a "substrate capacitance" for purposes of this disclosure.

When a voltage is applied between the upper electrode and the lower electrode, variation in the substrate capacitance becomes obvious. When the capacitance fluctuates, the capacitor cannot store a desired charge, whereby the electronic circuit on which the capacitor is mounted malfunctions. Further, when the electronic circuit is operated at a plurality of frequencies, when the substrate capacitance fluctuates greatly in comparison with the true capacitance or the stray capacitance at the operating frequency, a desired charge cannot be stored in some cases. As a result, the electronic circuit on which the capacitor is mounted malfunctions.

SUMMARY OF THE INVENTION

The present disclosure has been made in view of the above circumstances. It is an object of the present disclosure is to provide a capacitor in which generation of a substrate capacitance composed of an upper electrode, a substrate, and a lower electrode is prevented.

Thus, a capacitor according to an exemplary embodiment of the present disclosure includes a substrate; a lower electrode disposed on the substrate; a dielectric film disposed on the lower electrode; an upper electrode disposed on a part of the dielectric film; and a first terminal electrode that is connected to the upper electrode. Moreover, the upper electrode and the first terminal electrode are disposed in a region for forming the lower electrode in a plan view of the capacitor viewed from the first terminal electrode side.

According to the exemplary embodiment of the present disclosure, it is possible to prevent the generation of the substrate capacitance composed of the upper electrode, the substrate, and the lower electrode.

DETAILED DESCRIPTION

First Embodiment

Figure 1:
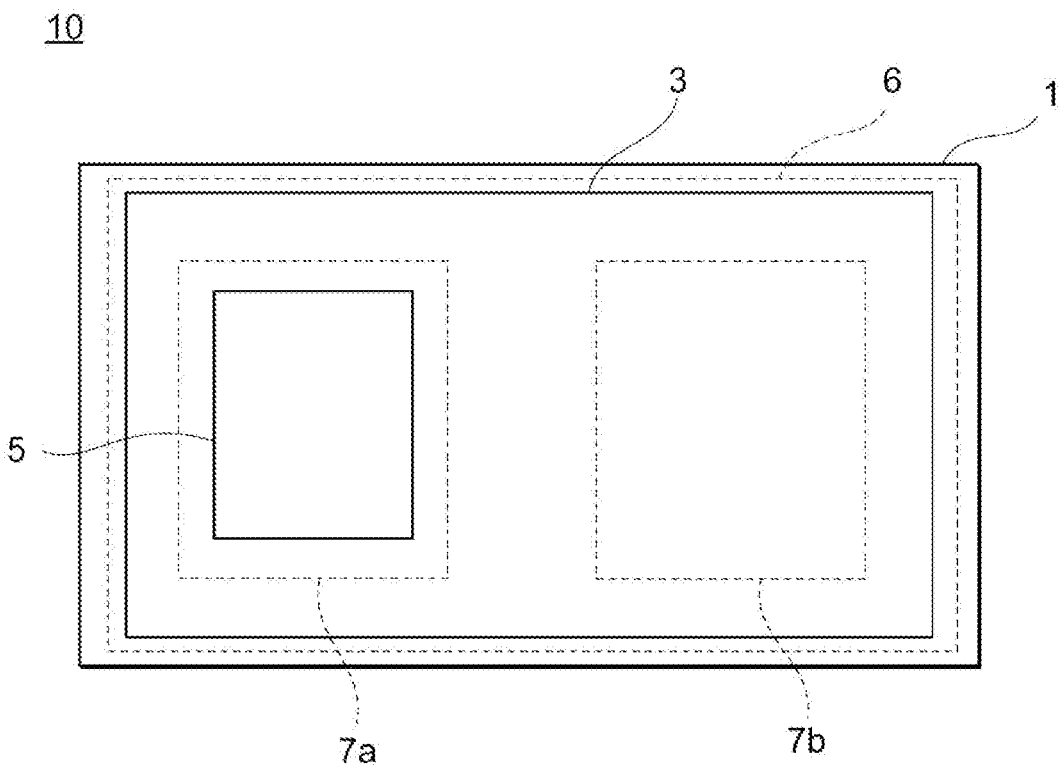
FIG. 1 is a plan view showing regions for forming elements of a capacitor according to a and exemplary embodiment.
Figure 2:
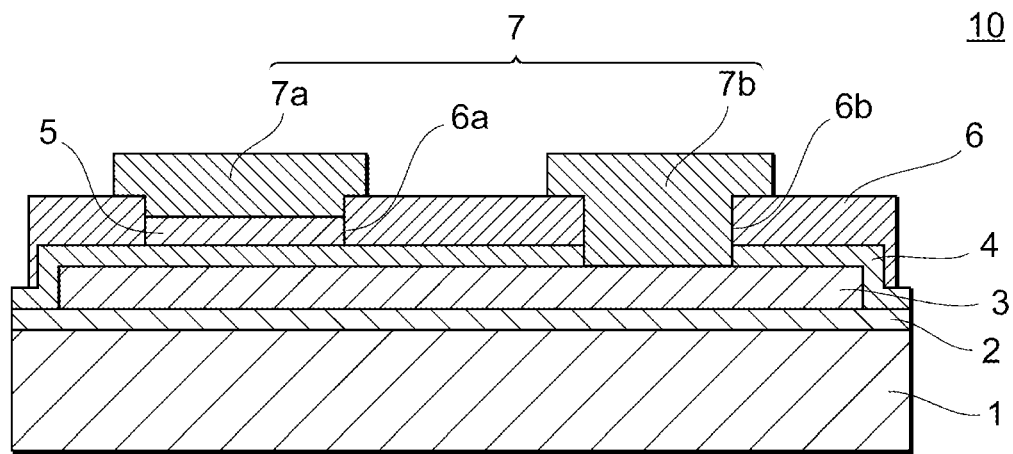
FIG. 2 is a cross-sectional view of the capacitor according to the exemplary embodiment.

FIG. 1 is a plan view showing regions for forming constituent elements of the capacitor according to an exemplary embodiment. FIG. 2 is a cross-sectional view of the capacitor according to the exemplary embodiment.

As shown, an insulating film 2 is formed on a substrate 1, and a lower electrode 3 is formed on the insulating film 2. Moreover, a dielectric film 4 covering the lower electrode 3 is formed on the insulating film 2 and the lower electrode 3. An upper electrode 5 is formed on a part of the dielectric film 4. A protective layer 6 is formed on the dielectric film 4 and the upper electrode 5, and a cavity 6a exposing the upper electrode 5 and a cavity 6b exposing a part of the lower electrode 3 are formed in the protective layer 6. A first terminal electrode 7a and a second terminal electrode 7b are formed on the protective layer 6 so that the cavities 6a and 6b of the protective layer 6 are embedded. As further shown, the first terminal electrode 7a is connected to the upper electrode 5 and the second terminal electrode 7b is connected to the lower electrode 3. It is noted that in exemplary aspects as described herein, the first terminal electrode 7a and the second terminal electrode 7b can simply be considered terminal electrode 7.

According to the exemplary embodiment, the upper electrode 5 and the first terminal electrode 7a are formed (i.e., disposed) in a region for forming the lower electrode 3 in a plan view (FIG. 1) of the capacitor viewed from the terminal electrode 7 side. Further, the second terminal electrode 7b is also formed in the region for forming the lower electrode 3 in a plan view of the capacitor viewed from the terminal electrode 7 side. Further, the upper electrode 5 is formed in the region for forming the first terminal electrode 7a in a plan view of the capacitor viewed from the terminal electrode 7 side. Hereinafter, an example of the material and thickness of each layer constituting the capacitor of the exemplary embodiment will be described.

It should be appreciated that the material of the substrate 1 is not limited, and a semiconductor substrate (such as a silicon substrate or a gallium arsenide substrate) or an insulating substrate (such as glass or alumina) is preferred. For example, the length of the long side of the substrate 1 is 200 µm to 600 µm, and the length of the short side is 100 µm to 300 µm. Further, the thickness of the substrate is not limited, and the thickness is preferably 5 µm or more and 300 µm or less. It should be appreciate that when the thickness of the substrate is less than 5 µm, the mechanical strength of the substrate is weakened, whereby cracking or chipping occurs in the wafer during back grinding or cutting with a dicing machine in the production of a capacitor described later. When the thickness of the substrate is larger than 300 µm, the thickness becomes larger than the vertical and horizontal lengths of the capacitor, and this makes handling difficult when mounting the capacitor.

Moreover, the thickness of the entire capacitor including the substrate is preferably 10 µm or more and 300 µm or less.

In addition, it should be appreciated that the material of the insulating film 2 is not limited, and an insulating film made of $SiO_2$, $SiN$, $Al_2O_3$, $HfO_2$, $Ta_2O_5$, $ZrO_2$ or the like is preferred. The thickness of the insulating film is not limited as long as the substrate and the capacitor formed on the substrate can be insulated, and the thickness is preferably 0.05 µm or more.

Yet further, it should be appreciated that the material of the lower electrode 3 is not limited, and a metal made of Cu, Ag, Au, Al, Ni, Cr, Ti or the like or a conductor containing these metals is preferred. The thickness of the lower electrode is not limited, and the thickness is preferably 0.5 µm or more and 10 µm or less, and more preferably 2 µm or more and 6 µm or less. When the thickness of the lower electrode is less than 0.5 µm, the resistance of the electrode is increased, and this affects the high-frequency characteristics of the capacitor. When the thickness of the lower electrode is larger than 10 µm, the mechanical strength of the element is weakened by the stress of the electrode, and the capacitor may be distorted.

In addition, it should be appreciated that the material of the dielectric film 4 is not limited, and an oxide or nitride such as $SiO_2$, $SiN$, $Al_2O_3$, $HfO_2$, $Ta_2O_5$ or $ZrO_2$ is preferred. The thickness of the dielectric film is not particularly limited, and the thickness is preferably 0.1 µm or more and 1.5 µm or less.

Furthermore, it should be appreciated that the material of the upper electrode 5 is not limited, and a metal made of Cu, Ag, Au, Al, Ni, Cr or Ti or the like or a conductor containing these metals is preferred. The thickness of the upper electrode 5 is not limited, and the thickness is preferably 0.5 µm or more and 10 µm or less, and more preferably 2 µm or more and 6 µm or less from the same reason as the lower electrode 3. The thickness of the lower electrode 3 is preferably greater than the thickness of the upper electrode 5. The length of the lower electrode 3 is longer than the length of the upper electrode 5. Therefore, when the thickness of the lower electrode 3 is small, the equivalent series resistance (ESR) increases.

Yet further, it should be appreciated that the material of the protective layer 6 is not particularly limited, and a resin material such as polyimide is preferred. The thickness of the protective layer 6 is not limited, and the thickness is preferably 1 µm or more and 20 µm or less. When the thickness of the protective layer is smaller than 1 µm, the capacitance between the first terminal electrode 7a and the lower electrode 3 sandwiching the protective layer 6 is larger than the capacitance between the lower electrode 3 and the upper electrode 5 sandwiching the dielectric film 4, whereby the voltage fluctuation and frequency characteristics of the capacitance sandwiching the protective layer 6 affect the entire capacitor. In order to make the thickness of the protective layer 6 larger than 20 µm, a high-viscosity material for the protective layer should be used, and it is difficult to control the thickness, which causes a variation in the capacitance of the capacitor. Further, the peripheral edge of the protective layer 6 may be located between the end of the diced substrate 1 and the sidewall of the dielectric film 4 covering the lower electrode 3 when viewed from the upper surface. The thickness of the dielectric film at the sidewall portion of the lower electrode 3 may become thin or the film may not be deposited on a stepped portion, so that it is possible to avoid contact between a solder and the lower electrode 3 when the capacitor according to the exemplary embodiment is mounted by soldering.

In addition, it should be appreciated that the material of the terminal electrode 7 is not limited, and the material is preferably a material having a lower resistivity than the materials of the lower electrode 3 and the upper electrode 5, and is preferably a metal made of Cu, Al or the like. This is because the use of the material can reduce the resistance.

Further, the outermost surface of the terminal electrode 7 may be Au or Sn according to an exemplary aspect.

In the exemplary embodiment, the upper electrode 5 and the first terminal electrode 7a are formed in the region for forming the lower electrode 3 in a plan view of the capacitor viewed from the terminal electrode 7 side (FIG. 1). In other words, the upper electrode 5 and the first terminal electrode 7a are formed only in a region defined by the peripheral edge of the lower electrode 3 in a plan view of the capacitor viewed from above. Such a structure is adopted, whereby when a voltage is applied, lines of electric force coming from the upper electrode 5 and the first terminal electrode 7a pass through the dielectric film 4 and the protective layer 6 and enter into the lower electrode 3 formed below the upper electrode 5 and the first terminal electrode 7a in the cross-sectional view of FIG. 2. Since the first terminal electrode 7a is not formed outside the lower electrode 3, the upper electrode 5 and the lower electrode 3 are not capacitively coupled across the substrate 1.

Figure 3:
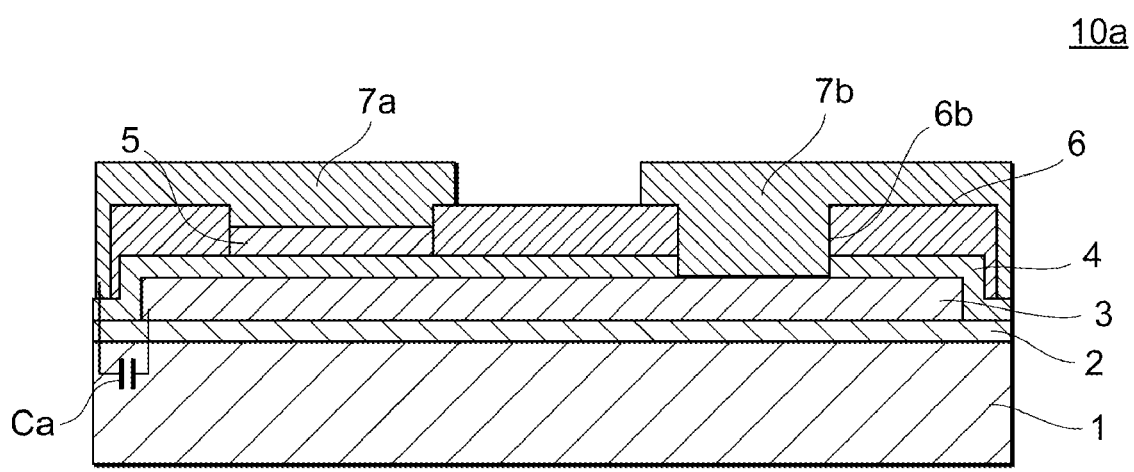
FIG. 3 is a cross-sectional view of a capacitor of a comparative example.

In contrast, in the structure of the comparative example shown in FIG. 3, the first terminal electrode 7a extends beyond the region for forming the lower electrode 3. Therefore, when a voltage is applied, a part of lines of electric force coming from the upper electrode 5 and the first terminal electrode 7a passes through the dielectric film 4, the protective layer 6, the insulating film 2, and the substrate 1, and enters into the lower electrode 3. This results in generation of a substrate capacitance Ca which is effectively a stray capacitance composed of the upper electrode 5, the substrate 1, and the lower electrode 3 and which is connected in parallel with a true capacitance composed of the upper electrode 5, the dielectric film 4, and the lower electrode 3. When a voltage is applied between the upper electrode 5 and the lower electrode 3 in the configuration of this comparative example, variation in the substrate capacitance Ca becomes obvious. When the capacitance fluctuates, the capacitor cannot store a desired charge, whereby the electronic circuit on which the capacitor is mounted malfunctions. Further, when operating the electronic circuit at a plurality of frequencies, when the substrate capacitance fluctuates greatly in comparison with the true capacitance or the stray capacitance at the operating frequency, a desired charge cannot be stored in some cases. As a result, the electronic circuit on which the capacitor is mounted malfunctions.

According to the exemplary embodiment, as described above, the upper electrode 5 and the lower electrode 3 are not capacitively coupled across the substrate 1, and thus the fluctuation in the substrate capacitance does not affect the overall capacitance during voltage application. Further, when the structure of the exemplary embodiment is adopted, the influence of the substrate capacitance does not become obvious, whereby the substrate capacitance does not affect the frequency characteristics of the overall capacitance of the capacitor.

Further, in the exemplary embodiment, the terminal electrode 7 is not formed on the sidewall portion of the protective layer 6, so the terminal electrode has a flat shape. In the case where the terminal electrode 7 is formed on the sidewall of the protective layer 6, a metal film forming the terminal electrode 7 is cut by a step difference of the sidewall, and the electric field concentrates during voltage application, thereby adversely affecting the dielectric strength of the capacitor. The flat terminal electrode 7 is formed only on the upper surface of the protective layer 6 so that the dielectric strength of the capacitor can be improved.

Further, in the exemplary embodiment, the upper electrode 5 is formed in the region for forming the first terminal electrode 7a in a plan view of the capacitor viewed from the terminal electrode 7 side. When the upper electrode 5 extends beyond the region for forming the terminal electrode 7, an equivalent series resistance (ESR) and an equivalent series inductance (ESL), which are connected in series with the true capacitance, are increased by the presence of the extending portion of the upper electrode 5, whereby the Q value decreases. According to the exemplary embodiment, the upper electrode 5 is formed in the region for forming the first terminal electrode 7a so that it is possible to reduce the equivalent series resistance (ESR) or the equivalent series inductance (ESL) and improve the Q value.

Subsequently, a method of producing the capacitor according to the present embodiment will be described with reference to FIGS. 4 to 9.

Figure 4:
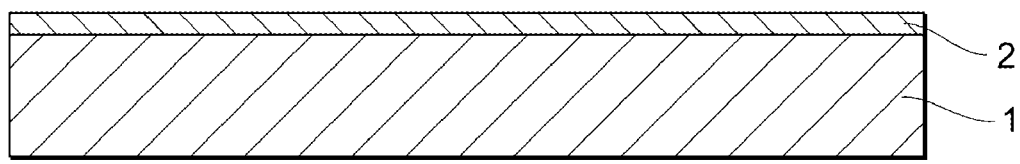
FIG. 4 is a process sectional view of the capacitor according to the exemplary embodiment.

As shown in FIG. 4, the insulating film 2 is formed on the substrate 1. The insulating film 2 is preferably an insulating film made of $SiO_2$, SiN or $Al_2O_3$. The insulating film 2 can be formed by a sputtering method or a chemical vapor deposition (CVD) method. The thickness of the insulating film 2 is preferably 0.1 μm or more.

Figure 5:
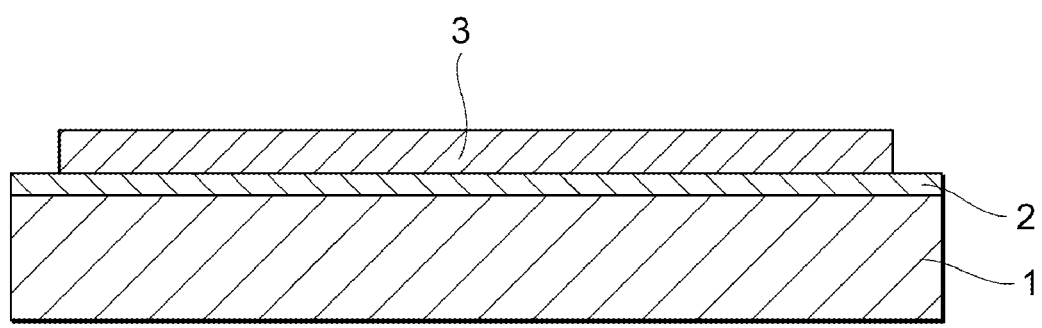
FIG. 5 is a process sectional view of the capacitor according to the exemplary embodiment.

Subsequently, as shown in FIG. 5, a pattern of the lower electrode 3 is formed on the insulating film 2. As the lower electrode 3, for example, a metal made of Cu, Ag, Au or Al, or a conductor containing these metals is deposited. The thickness of the lower electrode 3 is preferably 0.5 μm or more and 10 μm or less, and more preferably 2 to 6 μm. The method of forming the pattern of the lower electrode 3 is not limited, and, for example, a semi-additive method is used. In the semi-additive method, a seed layer is formed by sputtering or electroless plating, a resist pattern for opening a part of the seed layer is formed by a photolithography technique, a lower electrode material is formed in the cavity by electroless plating, the resist is peeled off, and the portion of the seed layer where the lower electrode material is not formed is finally removed.

Figure 6:
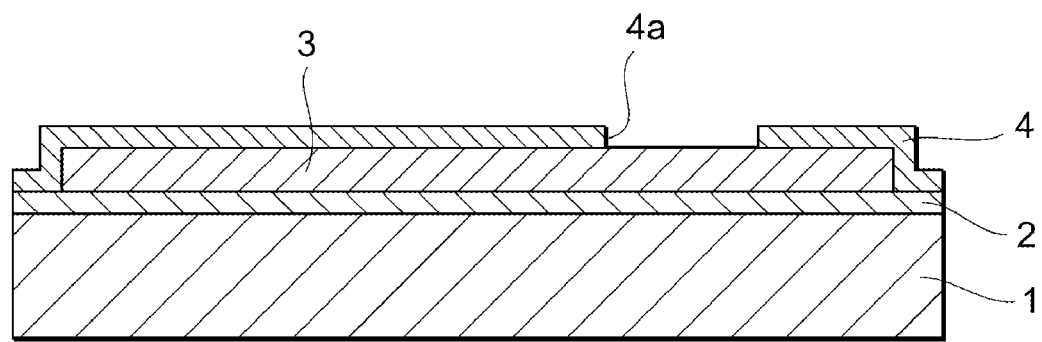
FIG. 6 is a process sectional view of the capacitor according to the exemplary embodiment.

Subsequently, as shown in FIG. 6, the dielectric film 4 is formed on the entire surface of the substrate including the region of the lower electrode 3, and patterning is performed to form a cavity 4a exposing a part of the dielectric film 4. As the dielectric film 4, for example, an oxide or nitride such as $SiO_2$, SiN, $Al_2O_3$, $HfO_2$ or $Ta_2O_5$ is formed with a thickness of 0.1 μm or more and 1.5 μm or less. The dielectric film 4 can be formed by the sputtering method or the CVD method. The patterning is performed by, for example, photolithography and etching.

Figure 7:
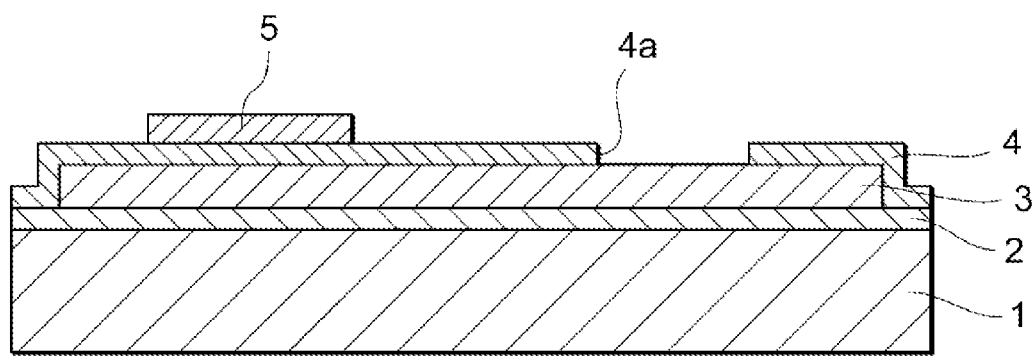
FIG. 7 is a process sectional view of the capacitor according to the exemplary embodiment.

Subsequently, as shown in FIG. 7, a pattern of the upper electrode 5 is formed on a part of the dielectric film 4. As the upper electrode 5, for example, a metal made of Cu, Ag, Au or Al, or a conductor containing these metals is deposited. The thickness of the upper electrode 5 is preferably 0.5 μm or more and 10 μm or less, and more preferably 2 to 6 μm. The method of forming the pattern of the upper electrode 5 is not limited and, similarly to the lower electrode 3, for example, the semi-additive method is used.

Figure 8:
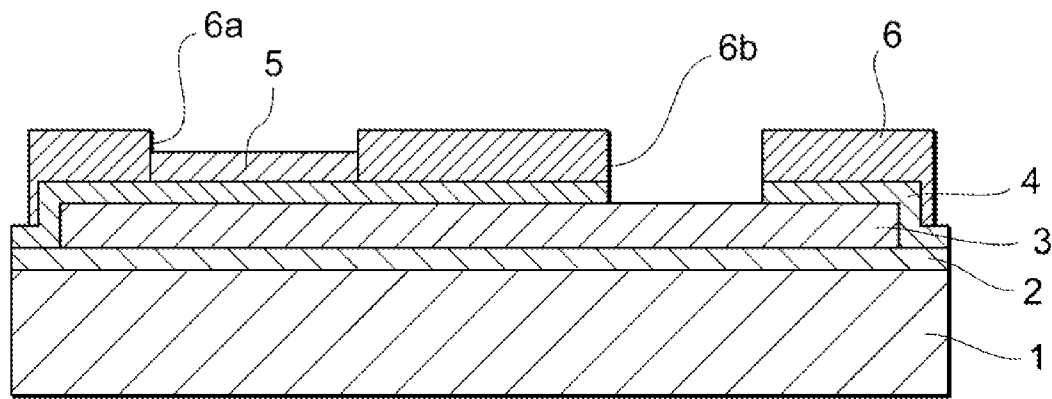
FIG. 8 is a process sectional view of the capacitor according to the exemplary embodiment.

Subsequently, as shown in FIG. 8, the protective layer 6 is deposited, and patterning is performed to form the cavity 6a exposing the upper electrode 5 and the cavity 6b exposing the dielectric film 4 in the protective layer 6. For example, a resin material such as polyimide is deposited as the protective layer 6. The thickness of the protective layer 6 is preferably 1 to 20 μm. In patterning, a resist pattern is formed on the protective layer 6 by the photolithography technique, and unnecessary portions of the protective layer 6 are etched using the resist pattern as a mask.

Figure 9:
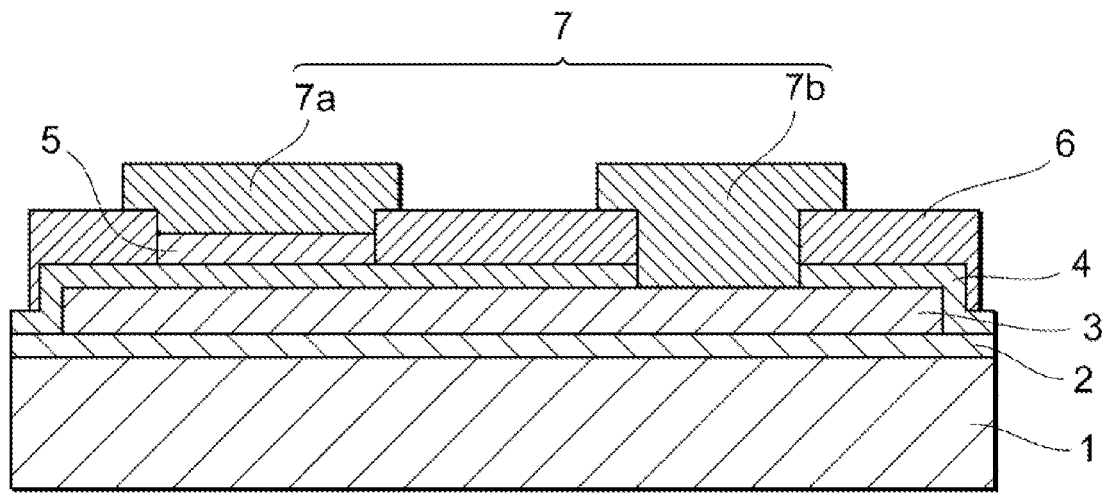
FIG. 9 is a process sectional view of the capacitor according to the exemplary embodiment.

Subsequently, as shown in FIG. 9, patterns are formed of the first terminal electrode 7a and the second terminal electrode 7b with which the cavities 6a and 6b of the protective layer 6 are embedded. In the exemplary embodiment, the first terminal electrode 7a and the second terminal electrode 7b are formed only in the region for forming the lower electrode 3. Further, it is preferable that the first terminal electrode 7a and the second terminal electrode 7b are formed only on the upper surface of the protective layer 6, and the first terminal electrode 7a and the second terminal electrode 7b are not formed on the sidewall of the protective layer 6. In addition, it is preferable that the first terminal electrode 7a is patterned so as to be coupled as much as possible (from a manufacturing perspective) to the entire surface of the upper electrode 5. For example, Cu or Al is used as the terminal electrode 7. The terminal electrode 7 made of Cu or Al can be formed by sputtering or plating. Further, the terminal electrode 7 is preferably plated with Ni/Au. It is reiterated that the method of forming the pattern of the terminal electrode 7 is not limited and, similarly to the lower electrode 3, for example, the semi-additive method is used.

The capacitor according to the exemplary embodiment is produced as described above.

Second Embodiment

In the second and subsequent embodiments, descriptions of matters common to those of the first embodiment are omitted, and only different points will be described. Particularly, the same operation and effect by the same configuration will not be referred to sequentially in each embodiment.

Figure 10:
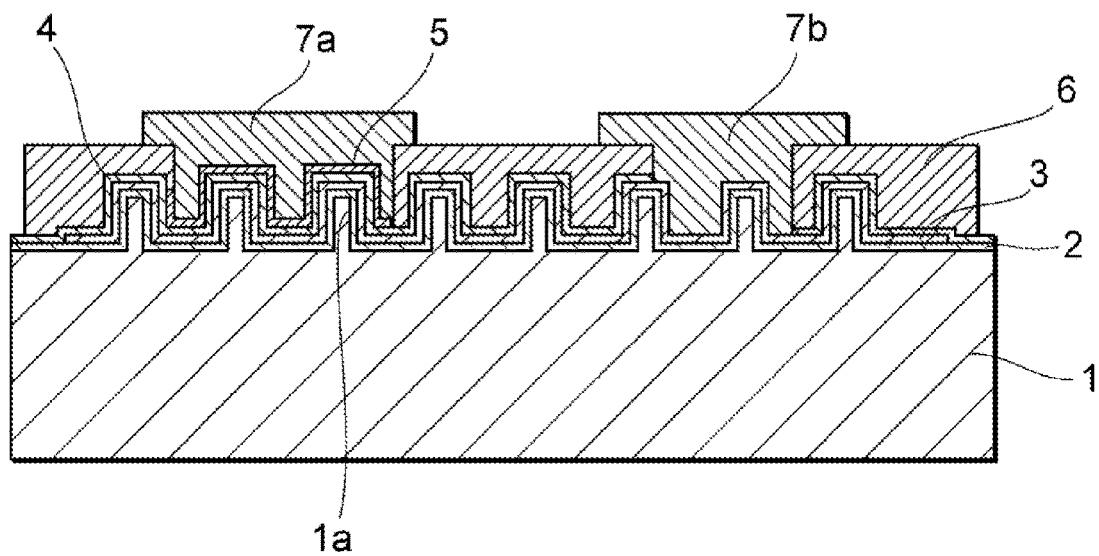
FIG. 10 is a cross-sectional view of a capacitor according to a second exemplary embodiment.

FIG. 10 is a cross-sectional view of the capacitor according to the second exemplary embodiment.

In the second exemplary embodiment, a plurality of trenches is formed in the region of the substrate 1 on which the lower electrode 3 is formed, and the trenches have an uneven structure. The insulating film 2, the lower electrode 3, the dielectric film 4, and the upper electrode 5 are sequentially formed so as to cover the trenches of the substrate 1.

According to the second exemplary embodiment, the plurality of trenches is formed in the region of the substrate 1 on which the lower electrode 3 is formed so that it is possible to increase the surface area of the lower electrode 3 to be capacitively coupled and increase the capacitance value of the capacitor.

The capacitor according to the second exemplary embodiment is produced in the following manner. First, a resist pattern is formed on the substrate 1, and a plurality of trenches 1a is formed in the substrate 1 by anisotropic dry etching using the resist pattern as a mask. After that, the steps shown in FIGS. 4 to 9 may be performed similarly to the first embodiment.

Third Embodiment

Figure 11:
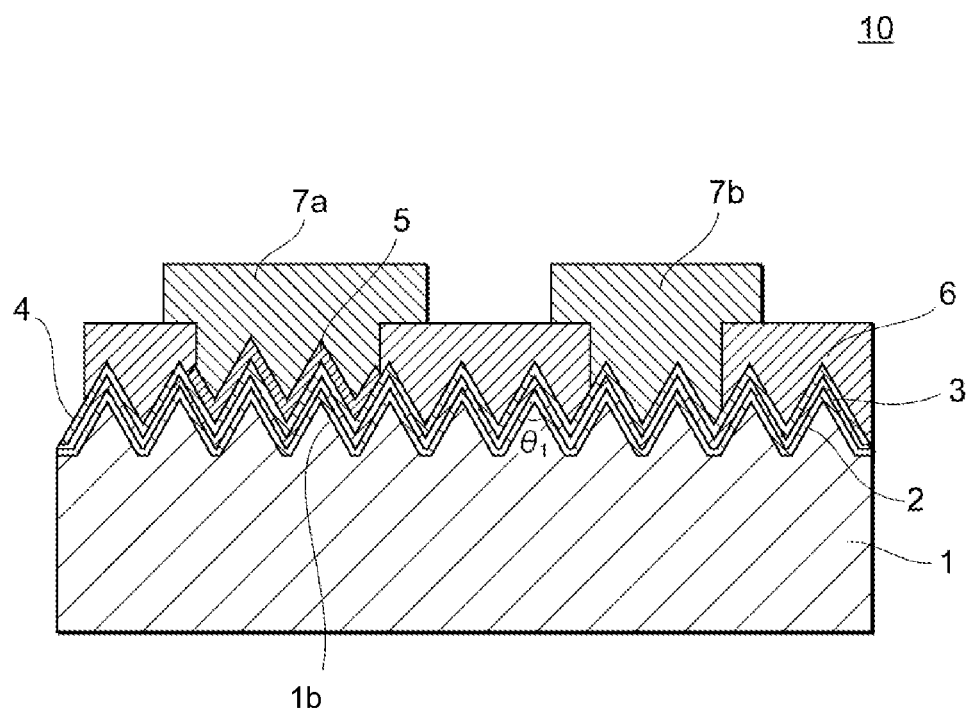
FIG. 11 is a cross-sectional view of a capacitor according to a third exemplary embodiment.

FIG. 11 is a cross-sectional view of the capacitor according to the third exemplary embodiment.

In the third exemplary embodiment, a pyramid-shaped texture structure is formed on the substrate 1. Accordingly, in the third embodiment, the insulating film 2, the lower electrode 3, the dielectric film 4, and the upper electrode 5 are sequentially formed so as to cover the slope of the pyramid of the substrate 1.

According to the third exemplary embodiment, a plurality of pyramid structures is formed in the region of the substrate 1 on which the lower electrode 3 is formed so that it is possible to increase the surface area of the lower electrode 3 to be capacitively coupled and increase the capacitance value of the capacitor.

In order to produce the capacitor according to the third embodiment, it is preferable to use a silicon substrate as a substrate material. The texture structure formed on the substrate 1 can be formed by immersing the silicon substrate of (100) plane in an alkaline solution such as NaOH or KOH to expose the (111) plane. When the (111) plane appears, an angle $\theta_1$ between two sides forming the slope of the pyramid in FIG. 11 is about 110°.

After that, the steps shown in FIGS. 4 to 9 may be performed similarly to the first embodiment.

Exemplary embodiments of the present disclosure has been described above.

Thus, as described above, a capacitor 10 is provided that includes a substrate 1; a lower electrode 3 formed on the substrate 1; a dielectric film 4 formed on the lower electrode 3; an upper electrode 5 formed on a part of the dielectric film 4; and a first terminal electrode 7a that is connected to the upper electrode 5, where the upper electrode 5 and the first terminal electrode 7a are formed in a region for forming the lower electrode 3 in a plan view of the capacitor 10 viewed from the first terminal electrode 7a side (FIG. 2). As a result, when a voltage is applied, lines of electric force coming from the upper electrode 5 and the first terminal electrode 7a pass through the dielectric film 4 and the protective layer 6 and enter into the lower electrode 3 formed below the upper electrode 5 and the first terminal electrode 7a in the cross-sectional view of FIG. 2. Since the first terminal electrode 7a is not formed outside the lower electrode 3, the upper electrode 5 and the lower electrode 3 are not capacitively coupled across the substrate 1.

As described above, the upper electrode 5 and the lower electrode 3 are not capacitively coupled across the substrate 1, and thus the fluctuation in the substrate capacitance does not affect the overall capacitance during voltage application. Further, when the structure of the present embodiment is adopted, the influence of the substrate capacitance does not become obvious, whereby the substrate capacitance does not affect the frequency characteristics of the overall capacitance of the capacitor.

For example, the capacitor further includes a second terminal electrode 7b that is connected to the lower electrode 3, where the second terminal electrode 7b is formed in the region for forming the lower electrode 3 in a plan view of the capacitor 10 viewed from the first terminal electrode 7a side (FIG. 2). Both the first terminal electrode 7a and the second terminal electrode 7b are formed in the region for forming the lower electrode 3 in this manner, whereby the terminal electrode 7 has a flat shape without being influenced by the step difference of the base. As a result, it is possible to prevent the metal film forming the terminal electrode 7 from being cut by the step difference of the sidewall, or to prevent the dielectric strength of the capacitor from being deteriorated due to concentrated electric field during voltage application.

Preferably, the upper electrode 5 is formed in the region for forming the first terminal electrode 7a in a plan view of the capacitor 10 viewed from the first terminal electrode 7a side (FIG. 2). Thus, it is possible to reduce the equivalent series resistance (ESR) and the equivalent series inductance (ESL), which are connected in series with the true capacitance, and to improve the Q value.

Preferably, the trenches 1a are formed in the region of the substrate 1 on which the lower electrode 3 is formed (FIG. 10). Thereby, the surface area of the lower electrode 3 to be capacitively coupled can be increased, and the capacitance value of the capacitor can be increased.

For example, the inner wall of a trench 1b has a tapered shape (FIG. 11). As a result, the stresses of the lower electrode 3 and the upper electrode 5 formed so as to cover the inner wall of the trench are reduced as compared with the case where the inner wall of the trench is vertical.

It is noted that each of the exemplary embodiments described above is for facilitating understanding of the present invention and is not intended to limit the present invention. The exemplary embodiments of the present invention can be modified and improved without departing from the spirit of the invention, and equivalents thereof are also included in the present invention. That is, ones obtained by appropriately modifying designs of the respective embodiments by those skilled in the art are also included within the scope of the present invention as long as they include the features of the present invention. For example, each of the elements included in the embodiments as well as its arrangement, material, condition, shape, size, and the like are not limited to those exemplified and may be appropriately changed. Further, the dimensional ratios of the drawings are not limited to the illustrated ratios. Further, it is to be understood that each of the embodiments is illustrative, and it is obvious that the structures shown in different embodiments can be partially replaced or combined, and these are also included in the scope of the present invention as long as they include features of the present invention.

DESCRIPTION OF REFERENCE SYMBOLS

1: Substrate
1a, 1b: Trench
2: Insulating film
3: Lower electrode
4: Dielectric film
4a: Cavity
5: Upper electrode
6: Protective layer
6a, 6b: Cavity
7: Terminal electrode
7a: First terminal electrode
7b: Second terminal electrode
10, 10a: Capacitor

The invention claimed is:

1. A capacitor comprising:
a substrate;
an insulating layer disposed on an entire surface of the substrate;
a lower electrode having a planar shape and disposed on a planar surface of the insulating layer and above the substrate, with the lower electrode not extending an entire surface of the insulating;
a dielectric film disposed on at least a portion of the lower electrode and covering a peripheral edge of the lower electrode and a side extending therefrom to the insulating layer, such that the dielectric film covers the lower electrode and is disposed directly on a portion of the insulating layer that is not covered by the lower electrode;
an upper electrode disposed on a portion of the dielectric film;
a first terminal electrode disposed above the upper electrode and coupled thereto;
a protective layer disposed on a portion of the dielectric film and covering a peripheral edge of the dielectric film; and
a second terminal electrode coupled to the lower electrode and that extends outside the capacitor to be externally exposed, with the second terminal electrode including a single and continuous electrode that extends directly from the lower electrode to be externally exposed outside the capacitor,
wherein the upper electrode and the first terminal electrode are disposed in a region where the lower electrode is formed in a plan view of the capacitor relative to the first terminal electrode,
wherein the protective layer comprises a plurality of cavities with the first terminal electrode extending in a first cavity of the protective layer and the second terminal electrode extending in a second cavity of the protective layer, and
wherein each of the first and second terminal electrodes are arranged on an upper surface of the protective layer and in the first and second cavities, respectively.

2. The capacitor according to claim 1, wherein the second terminal electrode is disposed in the region where the lower electrode is formed in the plan view of the capacitor relative to the first terminal electrode.

3. The capacitor according to claim 2, wherein the dielectric film comprises a cavity with the second terminal electrode disposed therein and directly coupled to the lower electrode.

4. The capacitor according to claim 1, wherein the upper electrode is disposed in a region where the first terminal electrode is formed in a plan view of the capacitor relative to the first terminal electrode.

5. The capacitor according to claim 1, wherein the upper electrode and the first terminal electrode are disposed in a region within the peripheral edge of the lower electrode in the plan view of the capacitor relative to the first terminal electrode.

6. The capacitor according to claim 5, wherein the upper electrode and the first terminal electrode are disposed in a position relative to the lower electrode, such that electric force from the upper electrode and the first terminal electrode pass through the dielectric film and into the lower electrode when a voltage is applied to the first terminal electrode, and the upper and lower electrodes are not capacitively coupled across the substrate.

7. The capacitor according to claim 1, wherein the protective layer comprises a thickness that is at least 1 μm in a thickness direction of the capacitor that extends orthogonally to the surface of the substrate.

8. The capacitor according to claim 1, wherein the upper electrode is disposed within a region of the first terminal in the plan view of the capacitor.

9. A capacitor comprising:
a substrate;
a lower electrode having a planar shape and disposed on a planar surface of the substrate and having an outer perimeter;
a dielectric film disposed on at least a portion of the lower electrode and covering the outer perimeter of the lower electrode and a side extending therefrom toward the substrate, such that the dielectric layer is disposed above a portion of the substrate without the lower electrode being disposed therebetween;
an upper electrode disposed on a portion of the dielectric film and in a region within the outer perimeter of the lower electrode relative to a plan view of the substrate;
a first terminal electrode disposed above the upper electrode and coupled thereto, with the first terminal electrode disposed in the region within the outer perimeter of the lower electrode relative to the plan view of the substrate;
a second terminal electrode coupled to the lower electrode and that extends outside the capacitor to be externally exposed, with the second terminal electrode including a single and continuous electrode that extends directly from the lower electrode to be externally exposed outside the capacitor; and
a protective layer disposed on a portion of the dielectric film and covering a peripheral edge of the dielectric film,
wherein the protective layer comprises a plurality of cavities with the first terminal electrode extending in a first cavity of the protective layer and the second terminal electrode extending in a second cavity of the protective layer, and
wherein each of the first and second terminal electrodes are arranged on an upper surface of the protective layer and in the first and second cavities, respectively.

10. The capacitor according to claim 9, wherein the second terminal electrode is disposed in a region within the outer perimeter of the lower electrode relative to the plan view of the substrate, and wherein the dielectric film comprises a cavity with the second terminal electrode disposed therein and directly coupled to the lower electrode.

11. The capacitor according to claim 9, further comprising an insulating film disposed between the substrate and the lower electrode.

12. The capacitor according to claim 11, wherein the insulating layer is disposed on an entire surface of the substrate and between the substrate and the lower electrode, with the dielectric film being disposed on a portion of the insulating layer that is not covered by the lower electrode.

13. The capacitor according to claim 9, wherein the upper electrode and the first terminal electrode are disposed in a position relative to the lower electrode, such that electric force from the upper electrode and the first terminal electrode pass through the dielectric film and into the lower electrode when a voltage is applied to the first terminal electrode, and the upper and lower electrodes are not capacitively coupled across the substrate.

14. The capacitor according to claim 9, wherein the protective layer comprises a thickness that is at least 1 µm in a thickness direction of the capacitor that extends orthogonally to the surface of the substrate.

* * * * *